Jan. 12, 1965 J. H. TEAF 3,165,000

REMOTE CONTROL TUNING SYSTEM

Filed Aug. 31, 1961 4 Sheets-Sheet 1

INVENTOR.
JOHN H. TEAF
BY
Bussir, Smith & Handy
ATTORNEYS

Jan. 12, 1965 J. H. TEAF 3,165,000

REMOTE CONTROL TUNING SYSTEM

Filed Aug. 31, 1961 4 Sheets-Sheet 2

INVENTOR.
JOHN H. TEAF
BY
ATTORNEYS

REMOTE CONTROL TUNING SYSTEM

Filed Aug. 31, 1961 4 Sheets-Sheet 3

INVENTOR.
JOHN H. TEAF
BY
Busser, Smith & Harding
ATTORNEYS

INVENTOR.
JOHN H. TEAF
BY
Brasser, Smith & Hanley
ATTORNEYS

United States Patent Office 3,165,000
Patented Jan. 12, 1965

3,165,000
REMOTE CONTROL TUNING SYSTEM
John H. Teaf, Merchantville, N.J., assignor to Radio Condenser Company, Camden, N.J., a corporation of New Jersey
Filed Aug. 31, 1961, Ser. No. 135,251
6 Claims. (Cl. 74—10.33)

The invention relates to systems for the remote control of tuning means, and more particularly to such control of the tuning of television receivers operating in the ultra high frequency bands.

The use of ultra high frequencies produces certain difficulties in tuning as contracted with the use of the so-called very high frequencies. One of the primary considerations is that the energy losses in a transmission line increase as frequency increases. Therefore, to the end that the shortest possible transmission line between a UHF antenna and tuner may be used, it is desirable to install the tuner close to the antenna, with tuning control being effected remotely from the viewing area. The usually desirable remote location of the antenna array, at which the tuner also would then be installed, may be a tower, rooftop or attic.

Television tuners may be either of a type permitting the reception of a predetermined limited number of channels, or of the type permitting continuous selection through a complete frequency range. In the former type the television receiver may be provided with a push button or dial selector which is preset in its design to a choice of, say, twelve channels in the VHF range. However, in UHF television, for example throughout the usual 470 to 890 megacycle range, some seventy channels are available for reception. Therefore, it has been usual to provide a tuning system making possible a continuous selection of channels at frequencies throughout the available range.

The actual tuning may be effected by means of a variable capacitance, and the mechanical arrangement may include a shaft rotatable typically through a range of 180°. Taking the case of the presently included objects, namely the association of the tuner with the antenna and remote control of the tuner, problems arise in the precise control of shaft rotation which is necessary if the ultimate degree of tuning selectivity is to be obtained, the position of the tuning element being quite critical. One apparent solution might be the remote control of motorized servo means for driving the condenser shaft at the antenna location to any desired angular position. However, such an expedient unavoidably involves the need for a highly accurate and expensive servo system, which it is an object of the invention to avoid.

In accordance with the invention the tuner assembly is positioned at the antenna and is controlled from a remote point, say the viewing area, through simple and dependable electrical controls which do not directly enter into the matter of accuracy of tuning. Operation of the condenser shaft is effected by mechanical means including an arrangement of treadle bar and adjustable slide assemblies of the type used in ordinary push button operated tuners such as are commonly used in automobile radios. Selection of the adjustable slides is effected remotely by the rather simple expedient of using ordinary solenoids, and operation of the slides is by means of a single cycle type of motor arrangement. As will be better understood hereafter, accuracy of tuning is advantageously dependent on perfection in the slide assemblies, the design of which has through experience been highly developed for reliability and high selectivity, and is not dependent on electronic complexities of a continuous remote control. While it is practical in this fashion to select only a limited number of channels, this is satisfactory since, in any given area generally only a few channels are receivable due to the limited range of UHF transmission.

A further aspect of the invention and of current trends is that of providing a channel selector unit operable by the television viewer at a distance from the viewing set. Typically, such selector unit is placed next to a viewer's armchair. Advantages of the invention are also found in a simple construction of the selector, which may be installed with wires running only to the remote tuning means but not across a room, for example to the television viewing set. Selection of channels is effected by light manual operation of push buttons operably connected to switching means as discussed in detail hereafter.

Accordingly, it is an object of the invention to provide a system for the remote control of tuning means, which system combines the features of simplicity, dependability, and superior tuning accuracy.

It is a further object to provide such a system in which tuning accuracy and economy of construction are secured through the use of standard mechanical slide assemblies, readily preset to tun those channels available to a viewer and changeable to tune new or alternative channels.

It is a further object of the invention to effect certain improvements in the channel selector unit operable by the television viewer.

While the invention is particularly applicable to UHF television because of its special problems, it is, of course, usable to advantage for VHF tuning as well.

Further objects and advantages will become apparent from the following description, read in conjunction with the accompanying drawings, in which.

Figures 1, 3, 4:
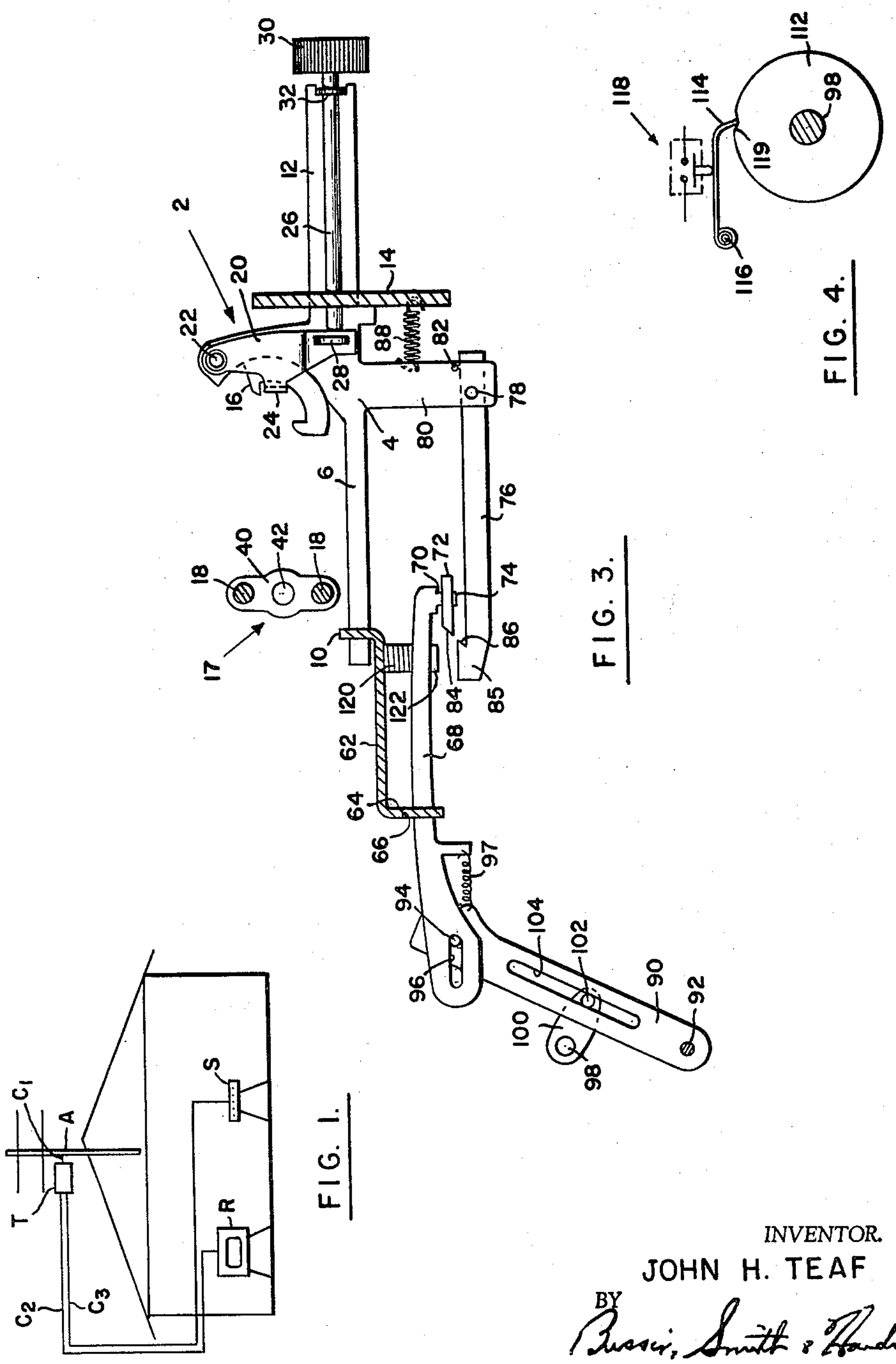
FIGURE 1 is an illustration of the location of the receiver, channel selector, tuner and antenna in accordance with the invention.
FIGURE 3 is a vertical cross-section taken as indicated by lines 3—3 in FIGURE 2, showing the slide actuating mechanism.
FIGURE 4 is a vertical cross-section, taken as indicated by lines 4—4 in FIGURE 2.

Referring to FIGURE 1, the arrangement of receiver, channel selector, tuner and antenna is there shown as it would be typically in a dwelling or other structure. The antenna A is mounted in conventional manner on the roof and has directly associated with it the tuner T, the cable connection between tuner and antenna being very short as indicated at $C_1$. A coaxial cable $C_2$ or other transmission line transmits the intermediate frequency signals from the tuner T to the television receiver R, which is located at a desired viewing position. This is consistent with what is usually desirable: the tuner effects conversion of the UHF signals to intermediate signals of a much lower frequency, the remote transmission of which presents no difficulty in the way of losses. The tuner, then, may consist, electrically, of merely one tube or transistor and its associated parts, powered by D.C. (and heater current if a tube is used) through leads which may be external to a coaxial cable or other transmission line or associated with the tuning control leads. The specific arrangement used may be of many obvious types and need not be described in detail. The tuner may, of course, more elaborately involve one or more amplifier stages. A push button-operated channel selector, generally indicated at S, may separate from the receiver R as illustrated, and a cable $C_3$ carrying a plurality of wires described hereafter connects the selector S with the tuner T at the antenna location, there being possible an absence of any cable running between the selector S and receiver R. As will be seen hereafter, the function of selector S and cable $C_3$ is solely to operate remotely the tuner T.

Figure 2:
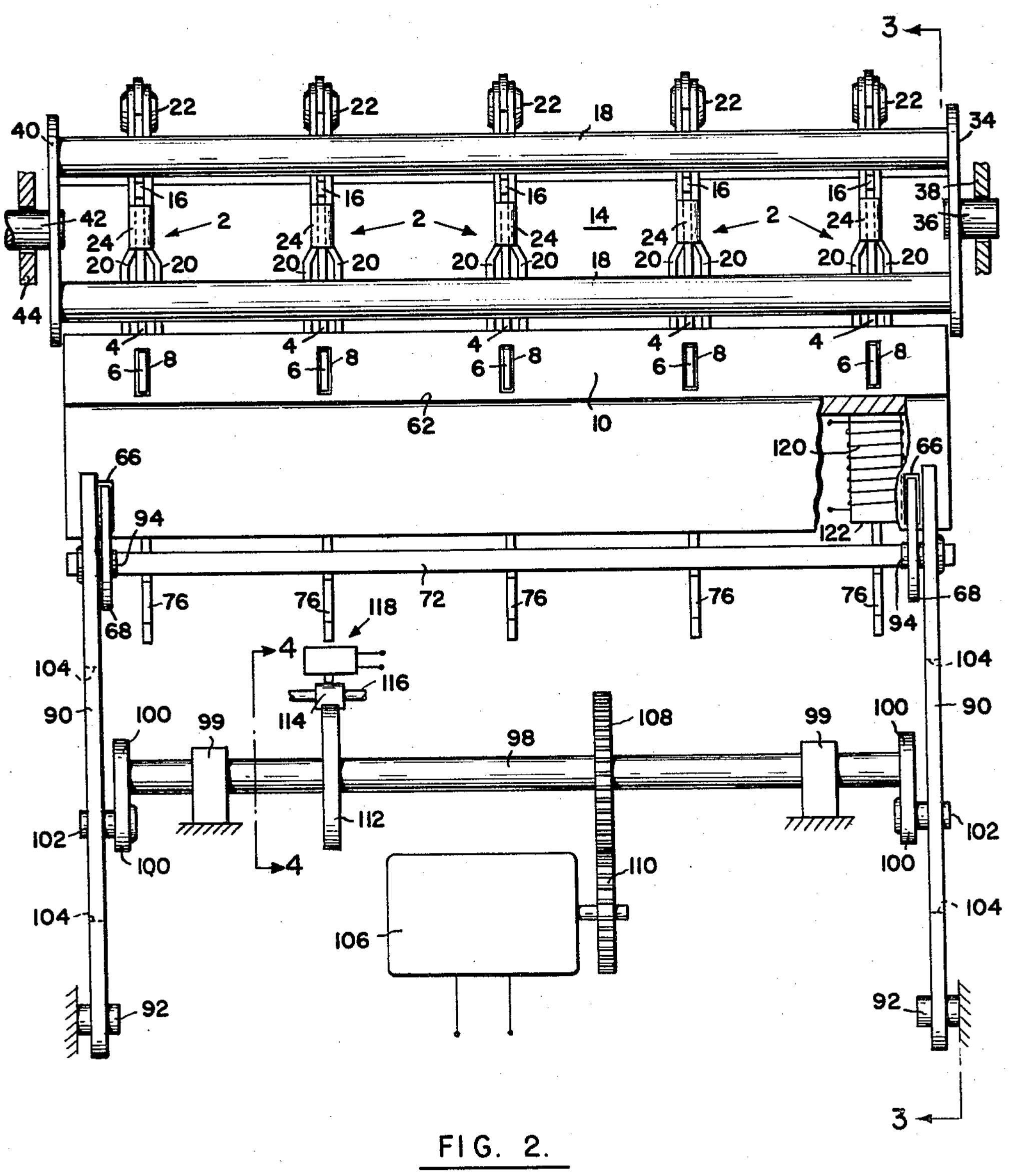
FIGURE 2 is an elevation showing the arrangement of mechanical slide assemblies and the mechanism for operation thereof.

Referring next to FIGURES 2 and 3, a purality of conventional slide assemblies 2 is illustrated. The particular slide assemblies 2 are of the type described in detail in Teaf et al. U.S. Patent 2,230,852 dated February 4, 1941, to which reference may be made for a detailed description of such slide assemblies. Although the type of slide assembly illustrated in said patent has been chosen for present purposes of description, it should be understood that alternatively other types of slide assemblies may be used. Examples of such alternate types of slide assemblies may be found in Teaf U.S. Patent 2,928,283, dated March 15, 1960, or in the copending application of Edward C. Horton, Serial No. 95,619, filed March 14, 1961, now U.S. Patent 3,086,401. Because the various types of slide assemblies are well-known they need not be discussed in great detail. Briefly, however, each slide assembly 2 comprises a flat element 4 having narrow forward extensions 6 guided within slots 8 in a vertical frame portion 10, and rearward extensions 12 guided within similar slots in a frame plate 14. Element 4 carries an adjustable cam 16 adapted to operate a conventional treadle bar assembly 17 having the usual bars 18. Cam 16 is locked against movement relative to element 4 by a lever 20 pivoted at 22. Lever 20 extends around the cam 16 and element 4 at 24, across opposite sides of the element (only one of the sides of lever 20 being shown in FIGURE 3), the movement of portion 24 relative to cam 16 being responsible for the release or locking thereof. Lever 20 is adapted to be rocked about pivot 22 by means of a rotatable shaft 26 which is threaded into a nut 28 held in slots in opposite sides of lever 20. Again, it may be mentioned that specific details of the conventional slide assemblies 2 are described in said U.S. Patent 2,230,852. A knob 30 is fixed on the end of shaft 26 for the purpose of manual rotation thereof, a washer 32 seated in the end of the extension 12 being provided as a bearing for shaft 26. The operation of each slide assembly 2 is such that rotation of shaft 26 in one direction relative to nut 28 effects the pivoting of lever 20 in a clockwise direction (FIGURE 3) to loosen and unlock cam 16, and relative rotation of shaft 26 in the opposite direction effects a counterclockwise pivoting of lever 20 to firmly lock the cam 16 in a given position.

The treadle bar assembly 17 includes further a member 34 in which the bars 18 are mounted at one end, the member 34 having a stud 36 rotatably received in a bearing provided by a frame member 38. At the opposite end of bars 18 they are mounted in a member 40 having centrally and rotatably affixed thereto a shaft 42 which is journalled in a bearing provided by a further frame member 44.

Inasmuch as the structure and operation of the parts thus far described are conventional, the localized aspects of operation of push button assemblies 2 will be briefly described. It will be understood that if cam 16 is locked relative to element 4, by the tightening of shaft 26, movement of the push button assembly to the left as viewed in FIGURE 3 will bring cam 16 into engagement with the bars 18. As a cam 16 engages bars 18, shaft 42 will be rotated to an angular position determined by the angular position in which that cam 16 has been locked relative to its element 4. Conversely, if a shaft 26 is rotated in a direction to render its associated cam 16 loosely adjustable, and this slide assembly is then moved toward the left in FIGURE 3, assuming that a slight resistance to rotation of shaft 42 is provided the engagement of the cam with bars 18 will result in its movement to an angular position determined by that of bars 18. The shaft 26 then may be tightened to lock this cam 16, and thereafter inward movement of the slide assembly will result in angular adjustment of shaft 42 as previously described.

Figure 5:
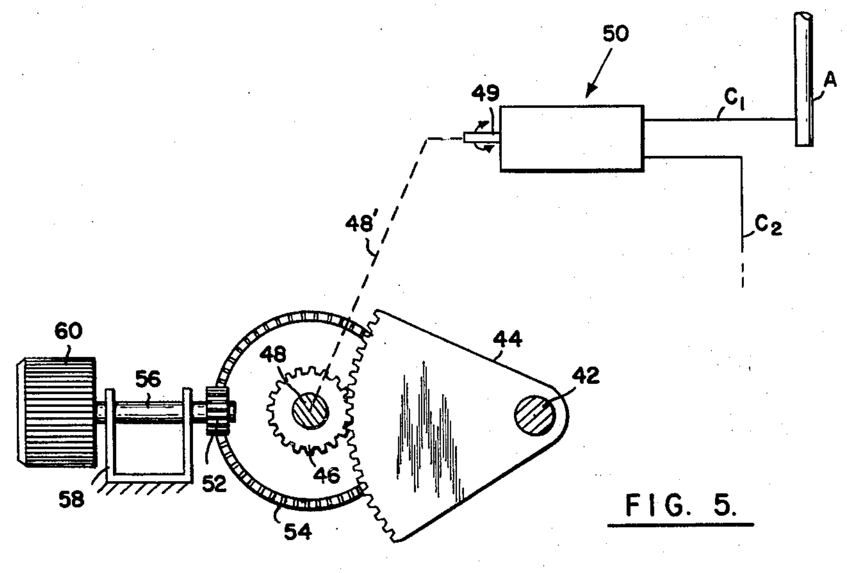
FIGURE 5 is a drawing of the driving connection of the slide assembly to the variable tuning means.

Referring to FIGURE 5, a gear segment 44 is affixed to shaft 42 and meshes with a pinion 46 affixed to a shaft 48. To eliminate any play in the meshing of gear segment 44 and pinion 46, the segment preferably is of the type comprising a pair of overlapping gear segments, one of which is loosely received on shaft 42, and interconnected by spring means. Such gear arangements are conventional, being disclosed for example in FIGURE 4 of Teaf U.S. Patent 2,898,767.

Through an extended connection schematically indicated at 48′, shaft 48 is operatively connected to the driving shaft 49 of tuning means 50 which may operate ordinarily on a principle of variable capacitance and may comprise one or more variable condensers, depending on the particular type of tuner used. The means 50, being located in close proximity to the antenna A, is coupled thereto by the correspondingly short transmission cable $C_1$, and to the television R by the cable $C_2$. Also affixed to shaft 48 is a crown gear 54 which meshes with a pinion 52. This pinion is affixed to a shaft 56, rotatably mounted in a frame member 58, and is operated manually by means of a knob 60 by the service man who installs, and establishes the tuning of, the tuner. In summation, therefore, it will be seen that rotation of shaft 42 through operation of one of the slide assemblies 2 results in rotation of shaft 49 to attain a desired tuning condition. For the purpose of preliminary manual tuning and the setting of the slide assemblies individually, however, knob 60 may be operated to rotate shaft 49 through means of pinion 52 and crown gear 54.

Returning to FIGURES 2, 3 and 4, a horizontal portion 62 of the frame structure is turned downwardly to form a vertical frame portion 64 having vertical slots 66 therein. In each of the slots 66, which are provided at opposite ends of the frame portion 64, there is reciprocably received a member 68. Each member 68 has a downwardly directed portion 70 of reduced width loosely projected through openings in a "raking bar" 72, the portion 70 being bent along the length of bar 72 as indicated at 74 to support it. Directly beneath raking bar 72, when in the position shown in FIGURE 3, are a plurality of members 76 each connected to a downwardly directed extension 80 of one of the slide assemblies. A stop pin 82 projecting from extension 80 limits counterclockwise rotation of member 76, thereby preventing dropping of its free end. Raking bar 72 has an angularly formed forward surface 84 as shown, and a correspondingly angularity is provided at a rearwardly directed edge 86 of each member 76. It may be noted that when all of the members 76 are in the position thereof shown in FIGURE 3, if raking bar 72 is pulled toward the left it will pass over and above the ends 85 of members 76. If, however, one of the members 76 is raised prior to leftward movement of raking bar 72, the same thereby will act to pull the entire associated slide assembly toward the left. Leftward movement of this slide assembly will result in operation of a treadle bar assembly 17 as previously described, and is against the action of a tension spring 88 connected between each extension 80 and the frame plate 14.

Levers 90 are pivotally mounted at 92, and each has its upper end connected to one of the members 68 by means of a pin 94 received in an elongate slot 96. A tension spring 97 connected between each member 90 and its associated member 68 normally maintains the right-hand end of elongate slot 96 against the pin 94. This spring permits overrun as described below during normal operation. It also prevents disturbance of presetting and/or jamming if more than one push button is depressed at one time. A shaft 98 is freely journalled in bearings 99 and at its ends, which terminate within the spaced members 90 as evident from FIGURE 2, arms 100 are fixedly mounted. Each arm 100 has a pin 102 received within a slot 104 extending along the length of a member 90, whereby rotation of shaft 98 will result in an oscillating movement of members 90 and reciprocation of members 68. Such rotation of shaft 98 is effected by a fractional horsepower motor 106 operatively connected to shaft 98 through reduction gearing 108 and 110. The electrical controls for operation of motor 106, as will be described hereafter, include a cam 112 affixed to shaft 98 and adapted to operate a switch 118. When arm 114 is engaged within a depression 119 in cam 112 the switch 118 resumes its normally open condition, but switch 118 is closed when cam 112 is rotated to lift arm 114 from the level of depression 119.

Supported from beneath the horizontal frame portion 62 are a plurality of solenoids, each comprising a winding 120 on a core 122, these solenoids corresponding in number to the plurality of slide assemblies 2 and their associated members 76. Each of the members 76 normally has its end 85 positioned directly under one of these solenoids. Cores 122 are of a material which does not have a high degree of magnetic retentivity, and when one of the windings is energized from a current source this results in a lifting of its associated member end 85 into position to be engaged by the raking bar 72 upon its movement toward the left (FIGURE 3). The energization of a winding 120 need be only temporary. Upon initiation of movement of raking bar 72 toward the left the angular configurations at 84 and 86, coupled with the action of spring 88, continue to retain a member 76 in raised position. In other words, these features prevent a dropping of the member 76 even though winding 120 may be thereafter deenergized.

Figure 6:
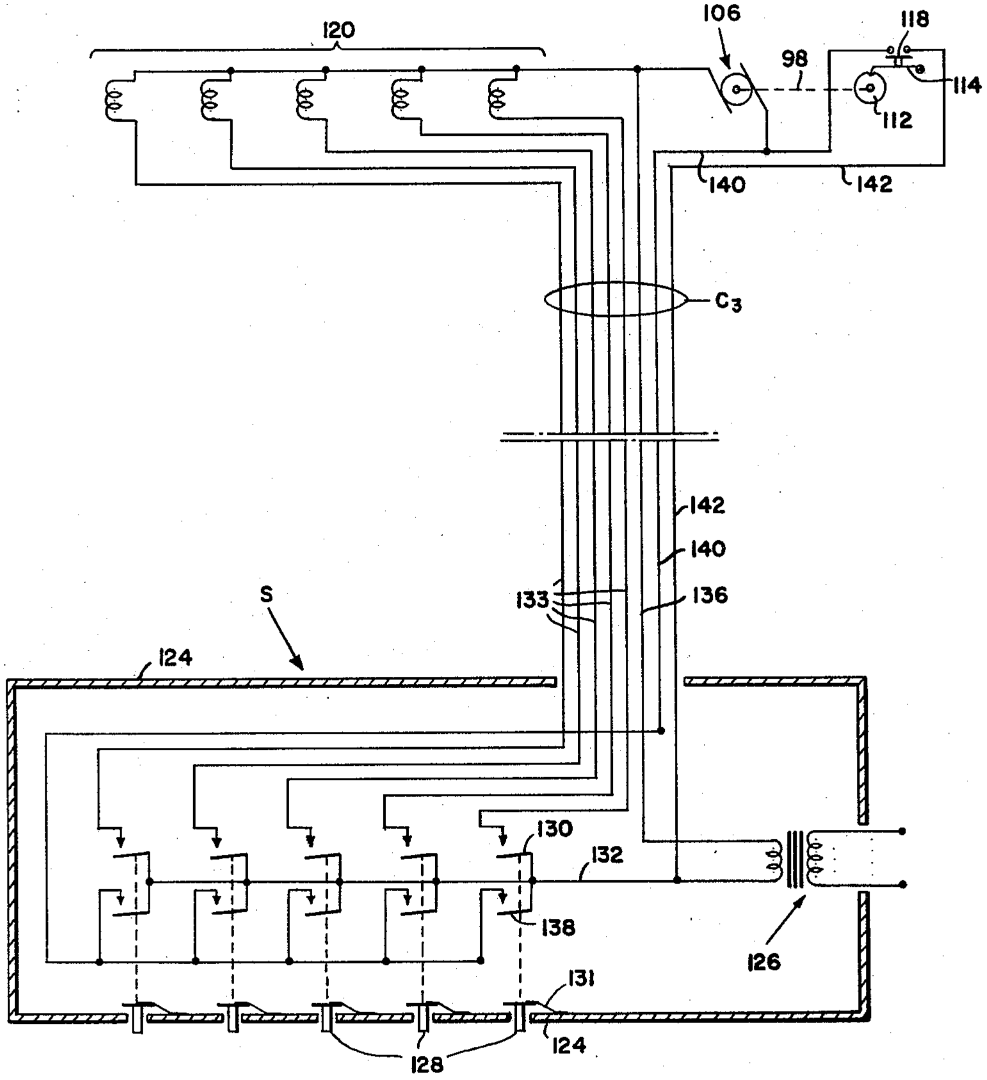
FIGURE 6 is a schematic diagram of the electrical controls for the channel selector and tuner.

Referring next to FIGURE 6, this illustrates the electrical controls involved in selection and operation of the mechanical elements thus far described. That portion of the controls which is associated with the selector S is contained within a suitable enclosure or cabinet 124. Power for operation of the electrical controls is derived from the house power circuit through a transformer 126. A plurality of push buttons 128, corresponding in number to the plurality of slide assemblies 2 and their associated windings 120, projects through the front of the enclosure 124 and each push button is adapted to close a pair of ganged switches 130 and 138. A plurality of individual springs 131 acting outwardly on the push buttons 128 serves to urge them to an outer position when not being manually depressed. Each switch 130 is connected in series with a single one of the windings 120 by one of the wires 133, each of these individual circuits being completed through common wires 132 and 136. Thus the depression of one of the push buttons 128 to close its ganged switch 130 will result in energization of that winding 120 which is in series therewith and which is associated with a slide assembly 2 preset for the selection of a channel identified with the depressed push button. The other switch 138, associated with each push button 128, may be closed to complete a series circuit to the motor 106 through wires 132, 136 and 140. It will be evident, however, that the last-mentioned circuit would be closed, and the motor 106 operated accordingly only as long as a switch 138 is held closed through depression of its push button 128. Therefore, the switch 118 is provided in an alternate circuit including wire 136 and a wire 142. When motor 106 operates to drive cam 112, lifting the switch arm 114 from depression 119, switch 118 closes to complete a circuit through motor 106 and thereby continued operation thereof is effected despite the opening of a switch 138 by release of its associated push button 128. Further aspects of this operation will be described hereafter.

The eight wires leading from the selector S to the installation site of antenna A and tuner T are collected to make up the previously mentioned cable $C_3$, and are the wires 133, 136, 140 and 142. Additionally there may be included in the same cable the power leads (not shown) for the elements (tubes or transistors) of the tuner.

The overall operation of the invention will now be described. Each of the five push button assemblies 2 is preset for the selection of a different television channel. This involves, for the setting of an individual slide assembly 2, the manual operation of the tuning means 50 by means of knob 60 to tune in the particular channel to which the slide assembly is to be set. By loosening of shaft 26 the cam 16 is loosened and the slide assembly is moved inwardly to a fully inner position whereat cam 16 engages treadle bars 18. The cam 16 thereby is moved to an angular position corresponding to that of the treadle bars 18, and shaft 26 is tightened to lock the cam 16 in such position. Thereafter, each inward movement of this particular slide assembly will restore the rotational setting of tuning shaft 49 through shaft 48, gearing 44 and 46, and shaft 42. This presetting operation is repeated in turn for each of the slide assemblies 2 until all five have been set for the selection of different desired channels.

Each of the push buttons 128 has a marking associated therewith and identifying a particular channel. Depression of any such push button closes its switches 130 and 138. The closing of switch 130 causes the winding 120 in series therewith, which coil is associated with a slide assembly 2 that has been preset to a channel corresponding to that identified with the depressed push button, and the member 76 connected to this particular slide assembly is lifted into the path of raking bar 72. Meanwhile, the closing of switch 138 completes a circuit through motor 106 and lines 136, 140. Motor 106 drives shaft 98 and arms 100 in a counterclockwise direction as viewed in FIGURE 3, thereby causing levers 90 to draw members 68 toward the left. This initial motion of the levers 98 is relatively slow, in the nature of a harmonic motion, because at this stage of operation the pins 102 are moving away from the pivots 92. Meanwhile, the driving of cam 112 lifts arm 114 from depression 119, and switch 118 is thereby closed. As operation of motor 106 begins the raking bar 72 is brought into engagement with that particular member 76 which has been raised by energization of its associated winding 120 and draws this member 76 with its connected slide assembly 2 toward the left as viewed in FIGURE 3. After engagement of raking bar 72 with said member 76 the selected push button 128 may be released, for it will be evident operation of motor 106 will not thereby be interrupted because of the closed condition of switch 118, and the deenergization of the solenoid will not cause a dropping of said member 76 because this is prevented by the action of spring 88 and the configurations at 84 and 86. The tension exerted by spring 88, and the sloping configuration at 84 and 86, prevent the dropping of member end 85 when its associated winding 120 is deenergized. This deenergization occurs when meanwhile the push button 128 is released. As the arms 100 rotate through approximately 180° cam 16 is brought into engagement with treadle bars 18 and through them drives the shaft 42 to an angular position related to the angular adjustment of cam 16. This rotation of shaft 42 is transmitted to the tuning capacitance or the like 50, thereby effecting tuning of the television receiver R to the channel selected. It may be noted that as cam 16 finally engages treadle bars 18, and further leftward movement of slide assembly 2 thereby is resisted, arms 90 are permitted to continue slightly to the left by virtue of the elongate slot 96 and spring 97. As the harmonic movement of levers 90 through arms 100 continues the movement of members 68 is reversed in direction, i.e., they begin to move toward the right in FIGURE 3. Return movement is completed much more quickly than the forward working stroke because in this stage of operation the pins 102 move closer to the pivots 92. As arms 100 finally return to their initial positions indicated in FIGURE 3, switch arm 114 again drops into depression 119 and thereby opens switch 118. Assuming that the selected push button 128 previously has been released, the opening of switch 118 effects an interruption of operation of motor 106 and the cycle of operation is now complete. At the end of the cycle the slide 6 is arrested in its initial position and the final movement of rake 72 releases the member 76 which drops to its initial position.

Figure 7:
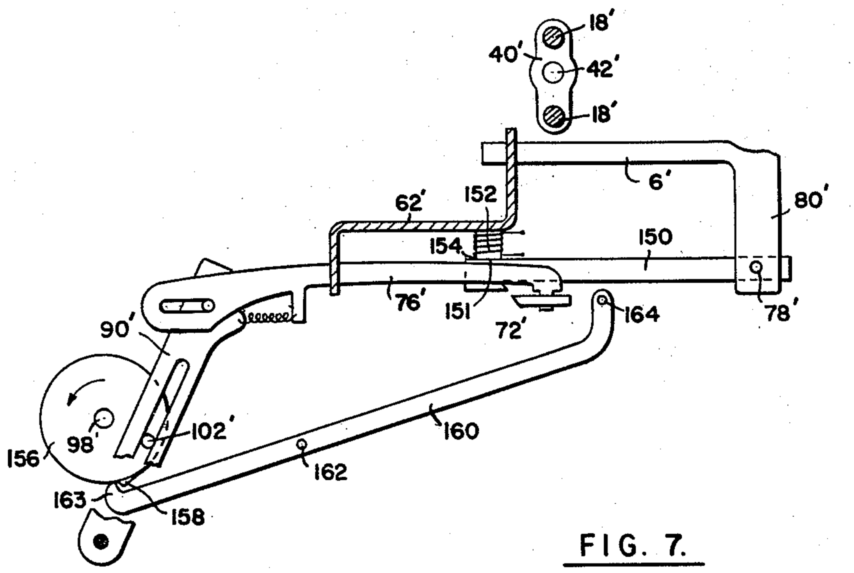
FIGURE 7 is a vertical cross-section, similar to FIGURE 2, illustrating a modified form of the invention.

An alternative arrangement for moving selectively the members 76 into raking bar engaging position is illustrated in FIGURE 7. In this figure those mechanical elements indicated by primed reference numerals will be understood to correspond to those parts identified by the same reference numerals in the preceding FIGURES 1 to 6. The arrangement is basically the same, therefore, and only the modified features will be described. In FIGURE 7 the members 150 correspond to members 76, except that it will be noted that members 150 have ends 151 which are above rather than below the raking bar 72'. In the connection of member 150 to slide assembly extension 80' the motion-limiting pin 82 is omitted. Instead of cores 122 there are provided magnets 154 of the permanent ceramic type comprising for example barium oxide-iron oxide. The permanent magnets 154 normally hold their respective members 150 above and out of the path of the raking bar 72'. However, windings 152, corresponding to windings 120 may be energized to temporarily neutralize the respective magnetic fields of magnets 154, thereby permitting an associated member 150 to drop into engagement with raking bar 72'. After being thus dropped, a member 150 is sufficiently distant from its magnet that it is not re-raised even though the magnetic field neutralizing current is interrupted. Thereafter, the operation of the apparatus is exactly the same as previously described with reference to FIGURES 1 to 6, with the exception of certain means provided to restore members 150 to their upper positions. The latter means comprises a cam 156 affixed to shaft 98' in place of each arm 100. Associated with each cam 156 is a lever 160, pivoted at 162, and having a follower end 163 adapted to be displaced by a raised portion 158 on the cam 156. A cross rod 164 interconnects the spaced levers 160. The operation is such that as pin 102' is restored to its original position indicated in FIGURE 7, the raised cam portion 158 rocks the lever 160 in a counterclockwise direction, thereby raising cross bar 164 into engagement with the particular member 150 which had been dropped into engagement with raking bar 72'. This raising of the member 150 brings it back into the effective magnetic field of permanent magnet 154 where it is held until the next energization of associated winding 152. It may be noted that this last described arrangement has the desirable characteristic that a minimum time of depression of a push button is required to initiate a tuning cycle, the member 150 dropping immediately to its position to be engaged by the rake and remain there even before rake motion starts. Sufficiently prolonged depression is, therefore, necessary only to close the switch 118.

The invention has been described in its application to the remote control of tuning, although it will be evident that certain other aspects of novelty are involved which are independent of remote control. For example, a highly advantageous feature resides in the selector means effecting tuning in response to the light operation of push button switches. Merely a "feather touch" on a push button is sufficient to close associated micro-switches, whereas this would provide insufficient force to operate directly a conventional slide and treadle bar assembly. The selector, then, may be associated directly with the tuning means, without any aspect of remote control, within the scope of the invention.

It will be understood that various departures from the specifically described embodiments of the invention may be made without departing from the scope thereof as defined by the following claims.

What is claimed is:

1. A system for operating a tuner from a remote location comprising a plurality of slide elements, means mounting each of said slide elements for reciprocating movement, adjustable cam means carried by each of said slide elements, means for transmitting movement of said cam means to said tuner for effecting tuning thereof, a movable member, means mounting said member for substantially linear reciprocating movement parallel to the movement of said slide elements, a plurality of coupling means, means movably mounting one of said coupling means on each of said slide elements for movement into and out of interlocking engagement with said member, individual actuating means for so moving each of said coupling means, said coupling means and said member having cooperating portions which interlock with each other during an initial part of said reciprocating movement of said member for holding said coupling means and said member in interlocking engagement, a drive motor, means for converting rotational drive from said motor into substantially linear reciprocating movement of said member, and selector means positioned at said remote location operatively connected to energize said drive means and to selectively operate said individual actuating means so as to effect remote tuning of said tuner.

2. The system as claimed in claim 1 wherein each of said coupling means comprises a link pivotally secured to one of said slide elements and gravity biased in the direction opposite to the direction of movement of said link produced by said actuating means.

3. The system as claimed in claim 2 wherein each of said actuating means include electromagnetic means for moving said links into engagement with said member against said gravity biasing force tending to disengage said links from said member.

4. The system as claimed in claim 1 further including means for retaining engagement between said coupling means and said member during reciprocating movement of said slide element in one direction and for automatically disengaging said coupling means and said member during reciprocating movement of said slide element in the opposite direction.

5. The system as claimed in claim 1 wherein each of said actuating means includes first magnetic means normally retaining said coupling means out of engagement with said member, and second magnetic means for momentarily overcoming the effect of said first magnetic means so as to permit said engagement.

6. The system as claimed in claim 1 wherein said cooperating portions on said coupling means and said member comprise a pair of mating sloped edges.

References Cited in the file of this patent

UNITED STATES PATENTS

| | | |
|---|---|---|
| 2,189,558 | Baxter | Feb. 6, 1940 |
| 2,214,506 | Manning et al. | Sept. 10, 1940 |
| 2,217,066 | Manning et al. | Oct. 8, 1940 |
| 2,349,085 | Forstrom | May 16, 1944 |
| 2,513,353 | Owens | July 4, 1950 |
| 2,743,797 | Whitaker | May 1, 1956 |
| 2,755,424 | Papitte | July 17, 1956 |
| 2,915,691 | Tyzack | Dec. 1, 1959 |
| 3,018,326 | Petrick et al. | Jan. 23, 1962 |